(12) United States Patent
Wu

(10) Patent No.: US 7,466,589 B2
(45) Date of Patent: Dec. 16, 2008

(54) NAND MEMORY CELL AT INITIALIZING STATE AND INITIALIZING PROCESS FOR NAND MEMORY CELL

(75) Inventor: Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/530,202

(22) Filed: Sep. 8, 2006

(65) Prior Publication Data

US 2008/0068889 A1    Mar. 20, 2008

(51) Int. Cl.
*G11C 11/34* (2006.01)
(52) U.S. Cl. .............................. 365/185.17; 365/185.22
(58) Field of Classification Search ............ 365/185.17, 365/185.22
See application file for complete search history.

(56) References Cited

U.S. PATENT DOCUMENTS

| | | | |
|---|---|---|---|
| 6,011,725 A | 1/2000 | Eitan | |
| 6,320,786 B1 | 11/2001 | Chang et al. | |
| 6,329,695 B1* | 12/2001 | Duane et al. | 257/408 |
| 6,487,114 B2 | 11/2002 | Jong et al. | |
| 6,885,072 B1* | 4/2005 | Jeng | 257/412 |
| 7,235,848 B2* | 6/2007 | Jeng | 257/390 |
| 2002/0125471 A1* | 9/2002 | Fitzgerald et al. | 257/19 |
| 2005/0121715 A1* | 6/2005 | Jeng | 257/314 |
| 2006/0006461 A1* | 1/2006 | Chidambaram | 257/341 |
| 2006/0118878 A1* | 6/2006 | Huang et al. | 257/369 |
| 2006/0145307 A1* | 7/2006 | Wu et al. | 257/653 |
| 2007/0132000 A1* | 6/2007 | Hsu et al. | 257/315 |

* cited by examiner

*Primary Examiner*—Michael T Tran
(74) *Attorney, Agent, or Firm*—J.C. Patents

(57) ABSTRACT

The invention is directed to a NAND memory cell at an initializing state. The NAND memory cell at the initializing state comprises a substrate, a gate, at least two doped regions, a carrier storage element and a plurality of carriers. The substrate has at least two isolation structures formed therein and the isolation structures are parallel to each other. The gate is disposed over the substrate and across the isolation structures. The doped regions are disposed at both sides of the gate in the substrate between the isolation structures respectively. The carrier storage element is disposed between the substrate and the gate. The carriers are disposed in the carrier storage elements and aggregating above the edges of the isolation structures.

33 Claims, 6 Drawing Sheets

, # NAND MEMORY CELL AT INITIALIZING STATE AND INITIALIZING PROCESS FOR NAND MEMORY CELL

BACKGROUND OF THE INVENTION

1. Field of Invention

The present invention relates to a flash memory cell. More particularly, the present invention relates to a NAND memory cell at an initializing state and a process for initializing a NAND memory cell.

2. Description of Related Art

As electronic technologies continue to improve, all types of information products including but not limited to the desktop computer, notebook computer and personal digital assistant (PDA), have been developed. Flash memory device has superior multi-access characteristics, including write, read, and erase, whereas data is retained in the cell even when power is off. Therefore, flash memory has become a broadly used non-volatile memory device for personal computers and electronics appliances.

Moreover, the popular flash memory array that is broadly used by the industry includes NOR gate array structure and NAND array structure. Since the memory cells in NAND array structure are connected, it is more integrated than the NOR array structure. Generally speaking, in a NAND array structure, programming and erasing operations are via +Vg F-N (Fowler-Nordheim) and –Vg FN tunneling effect for 1-bit/cell applications, respectively. We proposed an initializing NAND memory operation that is suitable for 2-bits/cell applications. The 2-bits/cell operation is performed with CHE (channel-hot-electron) program and +Vg FN erase methods. The initializing process can reduce the $2^{nd}$-bit effect of 2-bits/cell applications.

SUMMARY OF THE INVENTION

Accordingly, at least one objective of the present invention is to provide a NAND memory cell at an initializing state capable of providing an operation environment with a fringe induced barrier lowing effect for the operations of the NAND memory cell.

At least another objective of the present invention is to provide a NAND memory cell array at an initializing state capable of increasing the efficiency of the operations of the NAND memory cell array.

At least for the other objective of the present invention is to provide a process for initializing a NAND memory cell to decrease the second bit effect in the operations of the NAND memory cell.

The present invention provides a process for initializing a NAND memory cell array to create an operation environment so that the operations of the NAND memory cell array are performed at the fringes of the isolation structures.

To achieve these and other advantages and in accordance with the purpose of the invention, as embodied and broadly described herein, the invention provides a NAND memory cell at an initializing state. The NAND memory cell at the initializing state comprises a substrate, a gate, at least two doped regions, a carrier storage element and a plurality of carriers. The substrate has at least two isolation structures formed therein and the isolation structures are parallel to each other. The gate is disposed over the substrate and across the isolation structures. The doped regions are disposed at both sides of the gate in the substrate between the isolation structures respectively. The carrier storage element is disposed between the substrate and the gate. The carriers are disposed in the carrier storage elements and aggregating above the edges of the isolation structures.

According to one embodiment of the present invention, the NAND memory cell at the initializing state further comprises channel regions in the substrate between the doped regions and below the gate.

According to one embodiment of the present invention, a portion of the channel region right below the carriers in the carrier storage element is turned on.

According to one embodiment of the present invention, portions of the channel region along and adjacent to the edges of the isolation structures are turned on.

According to one embodiment of the present invention, the isolation structures includes shallow trench isolation structures.

According to one embodiment of the present invention, the carrier storage element comprises a carrier storage layer made of silicon nitride.

According to one embodiment of the present invention, the carrier storage element further comprises a bottom dielectric layer between the carrier storage layer and the substrate.

According to one embodiment of the present invention, the bottom dielectric layer is made of silicon oxide.

According to one embodiment of the present invention, the carrier storage element further comprises a top dielectric layer between the carrier storage layer and the gate.

According to one embodiment of the present invention, the top dielectric layer is made of silicon oxide.

The present invention also provides a NAND memory cell array at an initializing state. The NAND memory cell array at the initializing state comprises a plurality of isolation structures and a plurality of memory cell rows. The isolation structures are disposed on a substrate and parallel to each other. The memory cell rows are arranged in a memory cell array and the memory cell rows are disposed between the isolation structures respectively. Each of the memory cell rows comprises a plurality of gate structures, a plurality of doped regions and a plurality of carriers. The gate structures are disposed on the substrate successively, wherein each of the gate structures comprises a gate and a carrier storage element between the gate and the substrate. The doped regions are disposed between the gates in the substrate respectively. The carriers are disposed in the carrier storage elements and aggregating above the edges of the isolation structures.

According to one embodiment of the present invention, the NAND memory cell array at the initializing state further comprises a plurality of channel regions disposed between the doped regions under the gate structures respectively. In addition, for each of the channel region, a portion of the channel region below the carriers in the carrier storage element is turned on.

According to one embodiment of the present invention, for each of the channel region, portions of the channel region along and adjacent to edges of the isolation structures are turn on.

According to one embodiment of the present invention, the gates arranged in a same column and in adjacent memory cell rows are connected to each other.

According to one embodiment of the present invention, for each carrier storage element, the carrier storage element comprises a carrier storage layer made of silicon nitride.

According to one embodiment of the present invention, the carrier storage element further comprises a bottom dielectric layer between the carrier storage layer and the substrate.

According to one embodiment of the present invention, the bottom dielectric layer is made of silicon oxide.

According to one embodiment of the present invention, the carrier storage element further comprises a top dielectric layer between the carrier storage layer and the gate.

According to one embodiment of the present invention, the top dielectric layer is made of silicon oxide.

The present invention further provides a process for initializing a NAND memory cell. The process comprises steps of providing a NAND memory cell and initializing the NAND memory cell. The NAND memory cell has at least two isolation structures parallel to each other and formed in a substrate and the NAND memory cell further comprises a gate and a carrier storage element. The gate is disposed over the substrate and across the isolation structures and the carrier storage element is disposed between the gate and the substrate. Also, the NAND memory cell is initialized by applying a positive bias between the gate and the substrate of the NAND memory cell so that a plurality of carriers are injected into the carrier storage element above the edges of the isolation structures.

According to one embodiment of the present invention, during the step of initializing the NAND memory cell, the electric field between the edges of the isolation structures and the gate is relatively stronger than the electrical field between the gate and the substrate.

According to one embodiment of the present invention, when the positive bias is applied from the gate to the substrate, the carriers are injected from the gate into the carrier storage element.

According to one embodiment of the present invention, when the positive bias is applied from the substrate to the gate, the carriers are injected from the substrate into the carrier storage element.

According to one embodiment of the present invention, the NAND memory cell further comprises at least two doped regions and a channel region, wherein the doped regions are disposed at both sides of the gate in the substrate between the isolation structures and the channel region is located in the substrate between the doped region under the gate.

According to one embodiment of the present invention, during the carriers are injected into the carrier storage element, a portion of the channel region under the carriers in the carrier storage element is turned on simultaneously.

According to one embodiment of the present invention, during the carriers are injected into the carrier storage element, portions of the channel region along and adjacent to the edge of the isolation structures are turned on simultaneously.

The present invention provides a process for initializing a NAND memory cell array. The NAND memory cell comprises a plurality of isolation structures parallel to each other in a substrate and a plurality of memory cell rows disposed between the isolation structures respectively. Each of the memory cell rows further comprises a plurality of gate structures disposed on the substrate and a plurality of doped regions in the substrate between the gate structures. Each of the gate structures comprises a gate and a carrier storage element between the gate and the substrate and the gates at a same column in adjacent memory cell rows are connected to each other. The process provided by the present invention comprises applying a positive bias between the gates and the substrate. Therefore, a plurality of carriers are injected into the carrier storage elements and the carriers aggregate in a portion of the carrier storage elements along the edges of the isolation structures.

According to one embodiment of the present invention, during the step of applying the positive bias, the electric fields between the edges of the isolation structures and the gates is relatively stronger than the electrical fields between the gates and the substrate.

According to one embodiment of the present invention, when the positive bias is applied from the gates to the substrate, the carriers are injected from the gates into the carrier storage elements.

According to one embodiment of the present invention, when the positive bias is applied from the substrate to the gates, the carriers are injected from the substrate into the carrier storage elements.

According to one embodiment of the present invention, each of the memory cell rows further comprises a plurality of channel regions between the doped regions in the substrate under the gates.

According to one embodiment of the present invention, during the carriers are injected into the carrier storage elements, a portion of the channel regions under the carriers in the carrier storage elements is turned on simultaneously.

According to one embodiment of the present invention, wherein during the carriers are injected into the carrier storage element, portions of the channel regions along and adjacent to the edge of the isolation structures are turned on simultaneously.

In the present invention, while the bias is applied between the gate and the substrate of the NAND memory cell/the NAND memory cell array, the vertical electric field between the gate and the edge of the isolation structure is stronger than the vertical electric field between the gate and the substrate. Therefore, the injected carriers prefer to aggregate at the carrier storage element near the edge of the isolation structure. On the other words, the carriers inject into the carrier storage element along and adjacent to the edge of the isolation structure. Hence, an operation environment with a fringe induced barrier lowing (FIBL) effect is prepared for the NAND memory cell/the NAND memory cell array. Therefore, the programming operation and the erasing operation are performed with the FIBL effect at the fringe of the isolation structure. Accordingly, the efficiency of operations of the NAND memory cell is increased. Also, the second bit effect of the NAND memory cell is decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a novel initialized NAND memory cell structure and a novel approach for initializing the NAND memory cell are proposed. The initialized NAND structure according to the invention possesses carriers stored in the carrier storage element along and adjacent to the edge of the isolation structures. Because of the storage position of the carriers, a portion of the channel region, which is disposed between the doped regions, along and adjacent to edges of the isolation structures is turned on.

Figure 1:
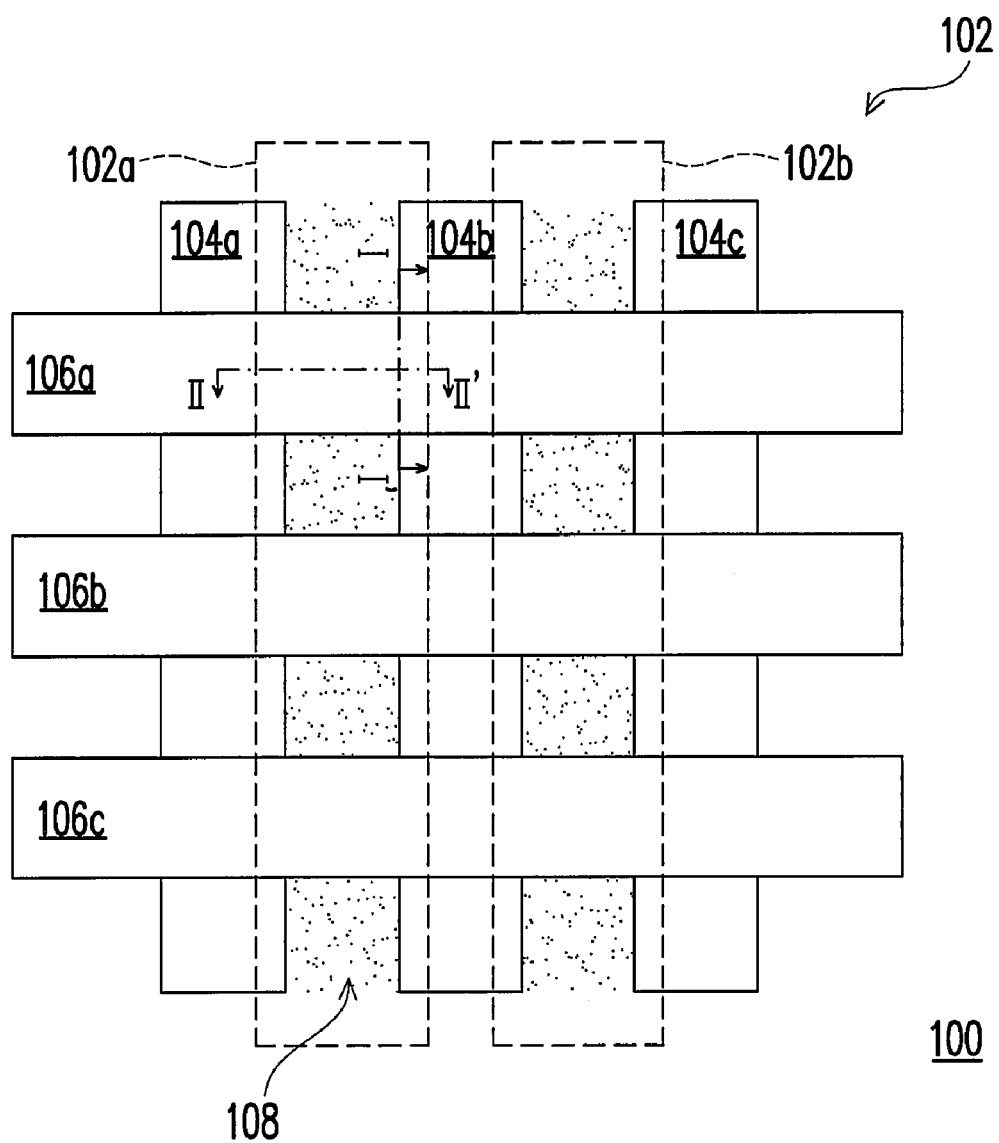
FIGS. 1 through 2 are top views schematically showing a process for initializing a NAND memory cell array according to one embodiment of the present invention.
Figure 1A:
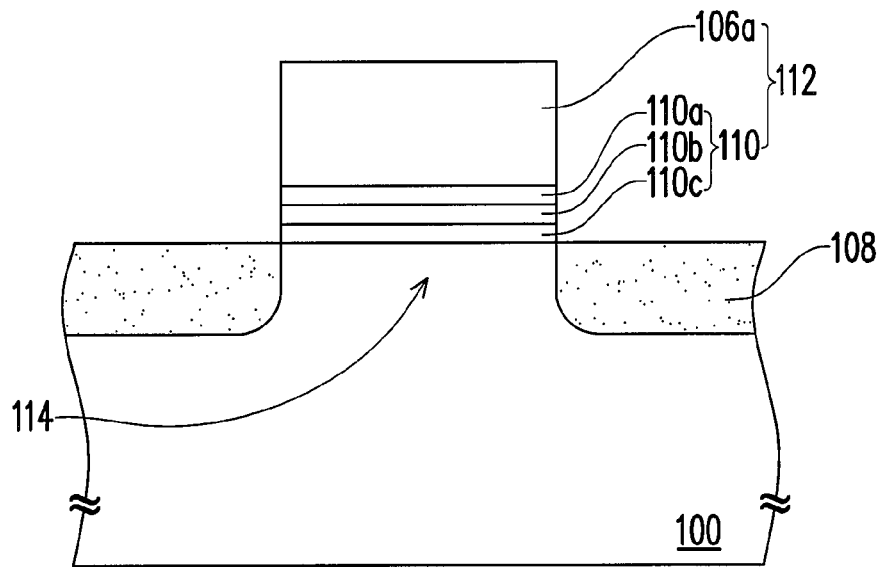
FIG. 1A and FIG. 1B are the cross-sectional views of an NAND memory cell along line I-I' and line II-II' of FIG. 1.
Figure 1B:
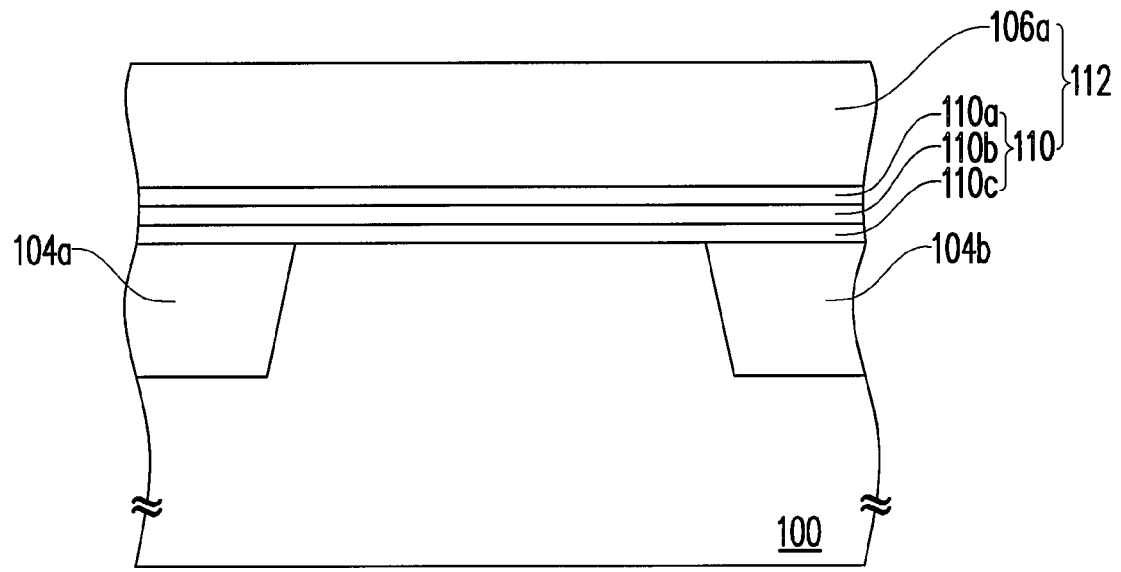
Figure 2:
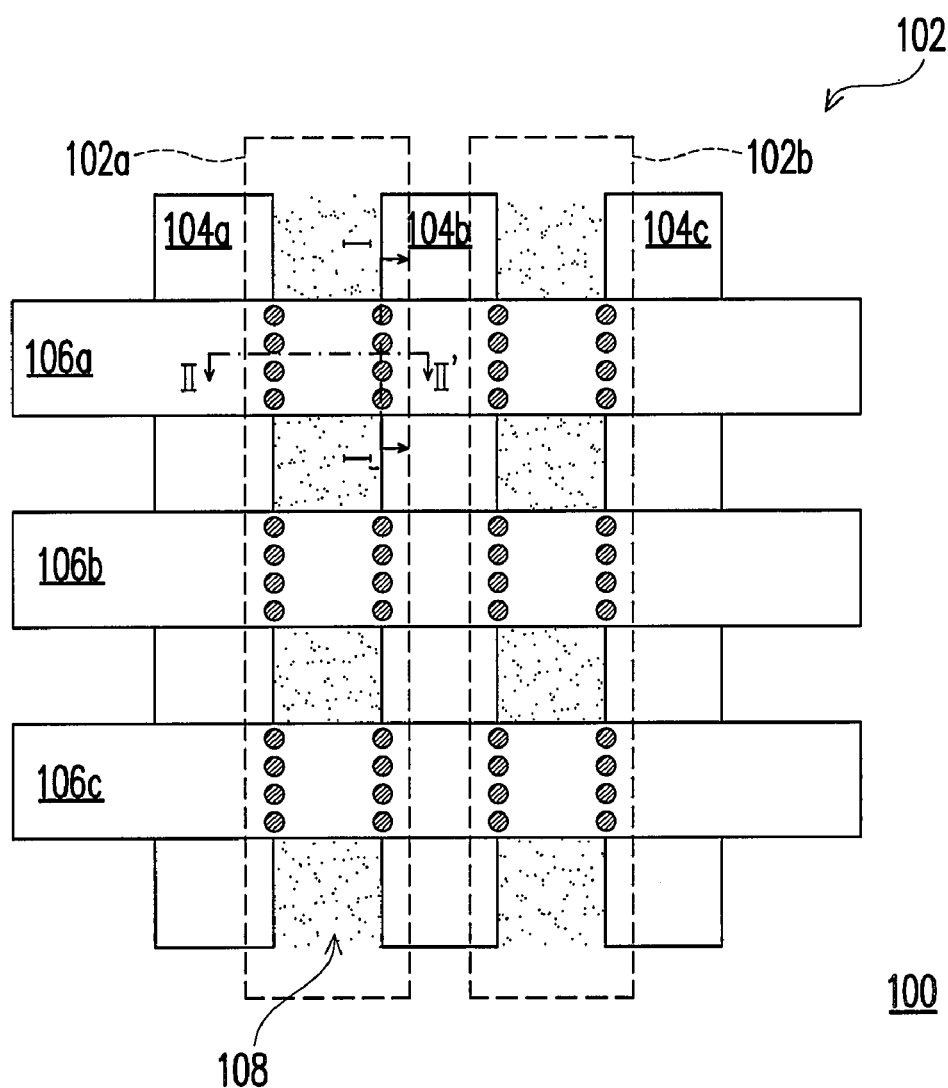

FIGS. 1 through 2 are top views schematically showing a process for initializing a NAND memory cell array according to one embodiment of the present invention. FIG. 1A and FIG. 1B are the cross-sectional views of an NAND memory cell along line I-I' and line II-II' of FIG. 1. As shown in FIG. 1, a NAND memory cell array 102 is provided. The NAND memory cell array comprises several memory cell rows such as memory cell rows 102a and 102b and several isolation structures such as isolation structures 104a, 104b and 104c. The memory cell rows are arranged in a memory cell array. The isolation structures 104a, 104b and 104c are parallel to each other and disposed in a substrate 100. The memory cell rows 102a and 102b are disposed between the isolation structures 104a, 104b and 104c respectively. The isolation structures can be, for example, the shallow trench isolation structures.

For each of the memory cell rows 102a and 102b, there are several gates 106a, 106b and 106c and several doped regions 108. The gates 106a, 106b and 106c are disposed over the substrate successively and the gates 106a, 106b and 106c in the same column at the adjacent memory cell rows are connected to each other. Furthermore, the doped regions 108 are disposed in the substrate between the gates 106a, 106b and 106c respectively.

As shown in FIG. 1A together with FIG. 1B, for each NAND memory cell in one of the memory cell rows 102a and 102b, the gate 106a is disposed over the substrate 100 and across the isolation structures 104a and 104b. Moreover, the doped region 108 is located at both sides of the gate 106a in the substrate 100. Furthermore, for each of the NAND memory cell in one of the memory cell rows 102a and 102b, there is a carrier storage element 110 disposed between the gate, such as gate 106a, and the substrate 100. Also, the carrier storage element 110 and the gate 106a together form a gate structure 112. Furthermore, for each NAND memory cell in one of the memory cell rows 102a and 102b, there is a channel region 114 in the substrate between the doped regions 108 under the gate structure 112. In addition, the carrier storage element 110 further comprises a carrier storage layer 110b. The carrier storage layer 110b can be, for example, made of silicon nitride. Moreover, the carrier storage layer 110 can, for example, further comprise a bottom dielectric layer 110c and a top dielectric layer 110a. In addition, the bottom dielectric layer 110c and the top dielectric layer 110a can be, for example made of silicon oxide. Therefore, the top dielectric layer 110a, the carrier storage layer 110b and the bottom dielectric layer 110c together form a three-layered sandwich-type carrier storage element 110 as shown in FIG. 1A and FIG. 1B.

Figure 3:
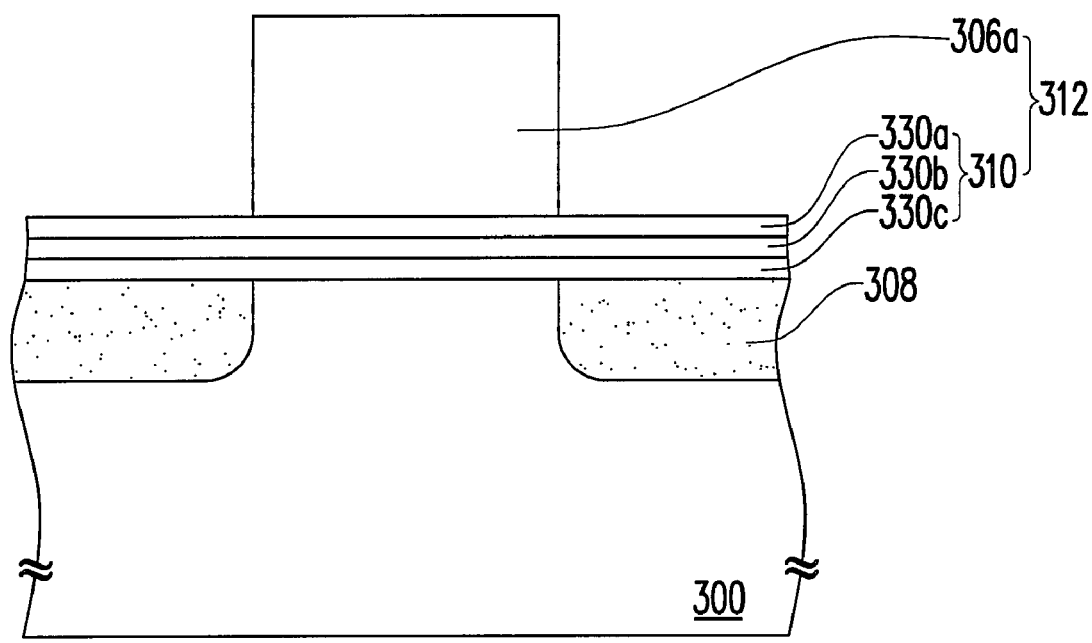
FIG. 3 is a cross-sectional view of a NAND memory cell according to another embodiment of the present invention.

In this embodiment, the carrier storage element is only disposed between the gate and the substrate. However, the present invention is not limited by this arrangement. FIG. 3 is a cross-sectional view of a NAND memory cell according to another embodiment of the present invention. As shown in FIG. 3, the carrier storage element 310 can be, for example, formed to cover the entire surface of the substrate 300 and the gate 306a is disposed on the carrier storage element 310 with exposing a portion of the carrier storage element 310.

Figure 2A:
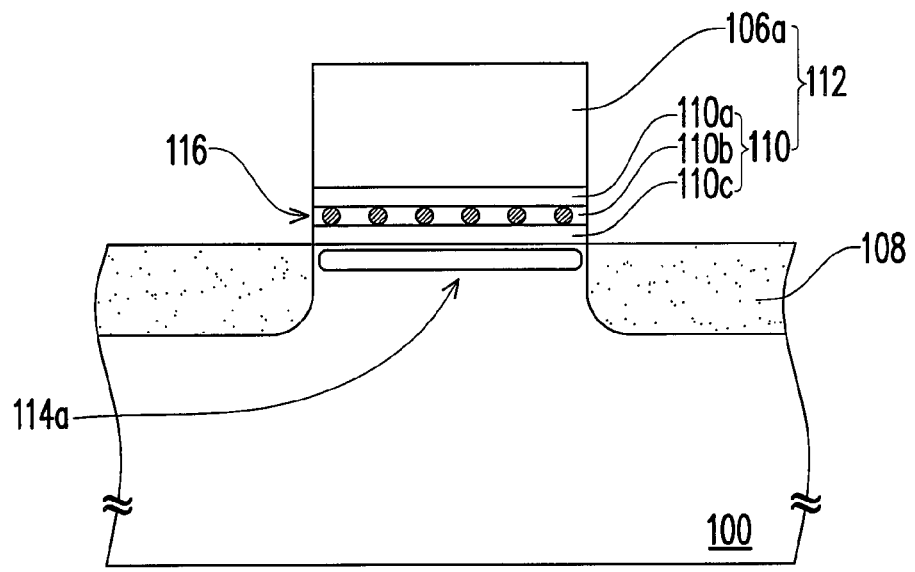
FIG. 2A and FIG. 2B are the cross-sectional views of an NAND memory cell along line I-I' and line II-II' of FIG. 2.
Figure 2B:
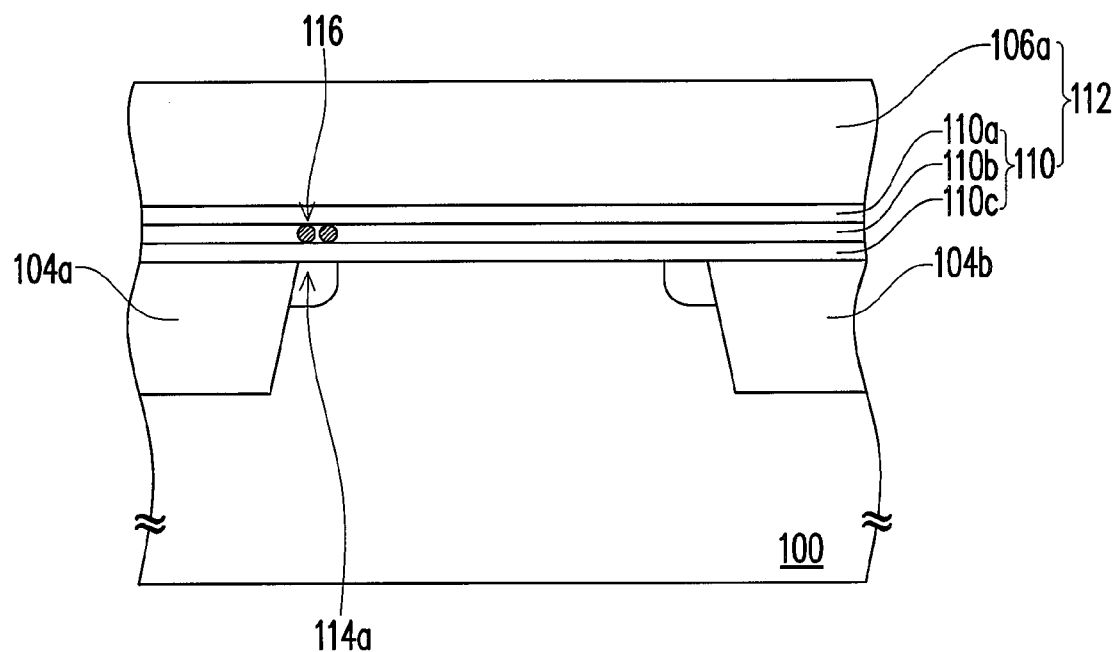

FIG. 2A and FIG. 2B are the cross-sectional views of an NAND memory cell along line I-I' and line II-II' of FIG. 2. As shown in FIG. 2 together with FIG. 2A and FIG. 2B, an initializing process is performed on the NAND memory cell array 102 by applying a positive bias between the substrate 100 and the gates 106a, 106b and 106c. Therefore, a plurality of carriers 116 are injected into the carrier storage layer 110b of the carrier storage element 110. Further, during the positive bias is applied between the substrate 100 and the gates 106a, 106b and 106c, the vertical electric fields between the gates and the edge/fringe of the isolation structures 104a, 104b and 104c are relatively stronger than the vertical electric fields between the gates and the substrate 100. Hence, the carriers 116 injected into the carrier storage layer 110b aggregate at a portion of the carrier storage layer 110b adjacent to the edge of the isolation structures 104a, 104b and 104c. That is, the carriers 116 aggregates in a portion of the carrier storage layer 110b along the edge of the isolation structures 104a, 104b and 104c.

As shown in FIG. 2A which is a cross-sectional view of a NAND memory cell along the edge of the isolation structure 104b at an initializing state, it is clearly that, the injected carriers 116 aggregate in the carrier storage layer 110b along the direction of the edge of the isolation structure 104b. Accordingly, a portion of the channel region 114 is turned on to be the turned-on channel 114a under the carriers 116 in the carrier storage layer 110b. That is, a portion of the channel region 114, which is under the gate structure 112 between the doped regions 108, is located along the edge/fringe of the isolation structure 104b.

As shown in FIG. 2B which is another cross-sectional view of the NAND memory cell at the initializing state, the injected carriers 116 aggregate in a portion of the carrier storage layer 110b above the edge of the isolation structures 104a and 104b. Hence, portions of the channel region adjacent to the isolation structures 104a and 104b are turned on.

Furthermore, when the doped regions 108 are N-type doped regions, the substrate 100 is a P-type substrate and the positive bias is applied form the gates to the substrate, the carriers 116 are injected into the carrier storage element 110 in a way of hole injection from the gates. Alternatively, when the doped regions 108 are N-type doped regions, the substrate 100 is a P-type substrate and the positive bias is applied form the substrate to the gate, the carriers 116 are injected into the carrier storage element 110 in a way of hole injection from the substrate. Further, in this embodiment, the carrier storage element is a three-layered sandwich type carrier storage element. However, the present invention is not limited to this arrangement. More specifically, when the carriers are injected into the carrier storage element in a way of hole injection form the gate, the carrier storage element can be composed of a carrier storage layer and a bottom dielectric layer between the carrier storage layer and the substrate. In addition, when the carriers are injected into the carrier storage element in a way of hole injection form the substrate, the carrier storage element can be composed of a carrier storage layer and a top dielectric layer between the carrier storage layer and the gate.

In the present invention, because of the initializing process of the NAND memory cell array, an operation environment with the fringe induced barrier lowing (FIBL) effect is created for each of the NAND memory cells in the NAND memory cell array. Therefore, the programming operation and the erasing operation of the NAND memory cell are operated near the fringe of the isolation structure with the FIBL effect.

Figure 4:
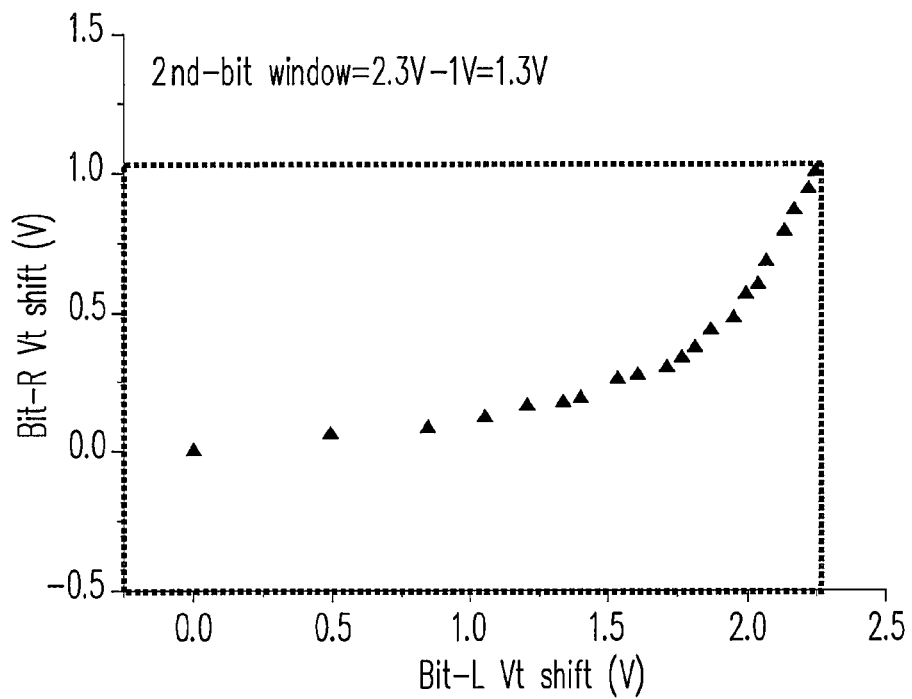
FIG. 4 is a 2nd-bit effect plot diagram of a 2-bits/cell structure.
Figure 5:
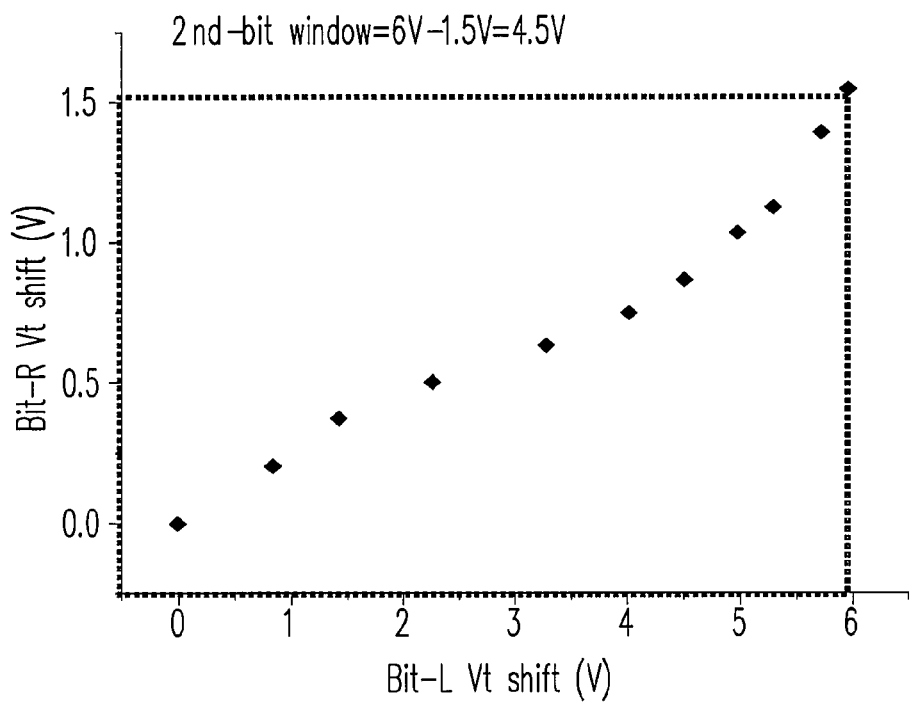
FIG. 5 is a 2nd-bit effect plot diagram of a 2-bits/cell structure at an initializing state according to the present invention.

FIG. 4 is a 2nd-bit effect plot diagram of a 2-bits/cell structure. FIG. 5 is a 2nd-bit effect plot diagram of a 2-bits/cell structure at an initializing state according to the present invention. As shown in FIG. 4, during the operations of the conventional 2-bits/cell structure, the second bit effect is strong and the second bit operation window is small. As shown in FIG. 5, after the initialization of the 2-bits/cell structure according to the present invention, the initialized 2-bits/cell structure is operated with the FIBL effect so that the second bit effect is reduced. Hence, it is clearly shown in FIG. 5 that the second bit operation window is relatively large and is about 4.5 voltage. Therefore, the initializing process for the 2-bits/cell NAND memory cell and for the 2-bits/cell NAND memory cell array not only increase the program and erase efficiency of the NAND memory cell but also decrease the second bit effect of the NAND memory cell.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A memory cell at an initializing state, comprising:
   a substrate having at least two isolation structures formed therein, wherein the isolation structures are parallel to each other;
   a gate disposed over the substrate and across the isolation structures;
   at least two doped regions disposed at both sides of the gate in the substrate between the isolation structures respectively;
   a carrier storage element disposed between the substrate and the gate; and
   a plurality of carriers disposed in the carrier storage elements and aggregating above the edges of the isolation structures.

2. The memory cell at the initializing state of claim 1 further comprising a channel region in the substrate between the doped regions and below the gate.

3. The memory cell at the initializing state of claim 2, wherein a portion of the channel region right below the carriers in the carrier storage element is turned on.

4. The memory cell at the initializing state of claim 2, wherein portions of the channel region along and adjacent to the edges of the isolation structures are turned on.

5. The memory cell at the initializing state of claim 1, wherein the isolation structures includes shallow trench isolation structures.

6. The memory cell at the initializing state of claim 1, wherein the carrier storage element comprises a carrier storage layer made of silicon nitride.

7. The memory cell at the initializing state of claim 6, wherein the carrier storage element further comprises a bottom dielectric layer between the carrier storage layer and the substrate.

8. The memory cell at the initializing state of claim 7, wherein the bottom dielectric layer is made of silicon oxide.

9. The memory cell at the initializing state of claim 6, wherein the carrier storage element further comprises a top dielectric layer between the carrier storage layer and the gate.

10. The memory cell at the initializing state of claim 9, wherein the top dielectric layer is made of silicon oxide.

11. A memory cell array at an initializing state, comprising:
    a plurality of isolation structures disposed on a substrate and parallel to each other;
    a plurality of memory cell rows arranged in a memory cell array, wherein the memory cell rows are disposed between the isolation structures respectively and each of the memory cell rows comprises:
       a plurality of gate structures disposed on the substrate successively, wherein each of the gate structures comprises a gate and a carrier storage element between the gate and the substrate;
       a plurality of doped regions disposed between the gates in the substrate respectively; and
       a plurality of carriers disposed in the carrier storage elements and aggregating above the edges of the isolation structures.

12. The memory cell array at the initializing state of claim 11 further comprising a plurality of channel regions disposed between the doped regions under the gate structures respectively, wherein, for each of the channel region, a portion of the channel region below the carriers in the carrier storage element is turned on.

13. The memory cell array at the initializing state of claim 12, wherein for each of the channel region, portions of the channel region along and adjacent to edges of the isolation structures are turn on.

14. The memory cell array at the initializing state of claim 11, wherein the gates arranged in a same column and in adjacent memory cell rows are connected to each other.

15. The memory cell array at the initializing state of claim 11, wherein, for each carrier storage element, the carrier storage element comprises a carrier storage layer made of silicon nitride.

16. The memory cell array at the initializing state of claim 15, wherein the carrier storage element further comprises a bottom dielectric layer between the carrier storage layer and the substrate.

17. The memory cell array at the initializing state of claim 16, wherein the bottom dielectric layer is made of silicon oxide.

18. The memory cell array at the initializing state of claim 15, wherein the carrier storage element further comprises a top dielectric layer between the carrier storage layer and the gate.

19. The memory cell array at the initializing state of claim 18, wherein the top dielectric layer is made of silicon oxide.

20. A process for initializing a memory cell, comprising:
    providing a memory cell having at least two isolation structures parallel to each other formed in a substrate, wherein the memory cell further comprises a gate and a carrier storage element, the gate is disposed over the substrate and across the isolation structures and the carrier storage element is disposed between the gate and the substrate; and
    initializing the memory cell by applying a positive bias between the gate and the substrate of the memory cell so that a plurality of carriers are injected into the carrier storage element above the edges of the isolation structures.

21. The process of claim 20, wherein, during the step of initializing the memory cell, the electric field between the edges of the isolation structures and the gate is relatively stronger than the electrical field between the gate and the substrate.

22. The process of claim 20, wherein when the positive bias is applied from the gate to the substrate, the carriers are injected from the gate into the carrier storage element.

23. The process of claim 20, wherein when the positive bias is applied from the substrate to the gate, the carriers are injected from the substrate into the carrier storage element.

24. The process of claim 20, wherein the memory cell further comprises at least two doped regions and a channel region, wherein the doped regions are disposed at both sides of the gate in the substrate between the isolation structures and the channel region is located in the substrate between the doped region under the gate.

25. The process of claim 24, wherein during the carriers are injected into the carrier storage element, a portion of the channel region under the carriers in the carrier storage element is turned on simultaneously.

26. The process of claim 24, wherein during the carriers are injected into the carrier storage element, portions of the channel region along and adjacent to the edge of the isolation structures are turned on simultaneously.

27. A process for initializing a memory cell array, wherein the memory cell comprises a plurality of isolation structures parallel to each other in a substrate and a plurality of memory cell rows disposed between the isolation structures respectively and each of the memory cell rows further comprises a plurality of gate structures disposed on the substrate and a plurality of doped regions in the substrate between the gate structures and each of the gate structures comprises a gate and a carrier storage element between the gate and the substrate and the gates at a same column in adjacent memory cell rows are connected to each other, the process comprising:

applying a positive bias between the gates and the substrate so that a plurality of carriers are injected into the carrier storage elements, wherein the carriers aggregate in a portion of the carrier storage elements along the edges of the isolation structures.

28. The process of claim 27, wherein, during the step of applying the positive bias, the electric fields between the edges of the isolation structures and the gates is relatively stronger than the electrical fields between the gates and the substrate.

29. The process of claim 27, wherein when the positive bias is applied from the gates to the substrate, the carriers are injected from the gates into the carrier storage elements.

30. The process of claim 27, wherein when the positive bias is applied from the substrate to the gates, the carriers are injected from the substrate into the carrier storage elements.

31. The process of claim 27, wherein each of the memory cell rows further comprises a plurality of channel regions between the doped regions in the substrate under the gates.

32. The process of claim 31, wherein during the carriers are injected into the carrier storage elements, a portion of the channel regions under the carriers in the carrier storage elements is turned on simultaneously.

33. The process of claim 31, wherein during the carriers are injected into the carrier storage element, portions of the channel regions along and adjacent to the edge of the isolation structures are turned on simultaneously.

* * * * *